(12) United States Patent
Kinsley

(10) Patent No.: US 10,199,356 B2
(45) Date of Patent: Feb. 5, 2019

(54) SEMICONDUCTOR DEVICE ASSEMBLES WITH ELECTRICALLY FUNCTIONAL HEAT TRANSFER STRUCTURES

(71) Applicant: Micron Technology, Inc., Boise, ID (US)

(72) Inventor: Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/442,392

(22) Filed: Feb. 24, 2017

(65) Prior Publication Data

US 2018/0247915 A1 Aug. 30, 2018

(51) Int. Cl.
| | | |
|---|---|---|
| *H01L 23/04* | (2006.01) | |
| *H01L 23/36* | (2006.01) | |
| *H01L 49/02* | (2006.01) | |
| *H01L 25/065* | (2006.01) | |

(52) U.S. Cl.
CPC .......... *H01L 25/0657* (2013.01); *H01L 23/04* (2013.01); *H01L 23/36* (2013.01); *H01L 28/20* (2013.01); *H01L 28/40* (2013.01); *H01L 2225/06541* (2013.01); *H01L 2225/06589* (2013.01)

(58) Field of Classification Search
CPC ..................... H01L 23/3738; H01L 2023/4068
See application file for complete search history.

(56) References Cited

U.S. PATENT DOCUMENTS

| | | | |
|---|---|---|---|
| 6,376,769 B1 | 4/2002 | Chung et al. | |
| 8,618,619 B1 | 12/2013 | Miks et al. | |
| 2009/0014827 A1 | 1/2009 | Lim et al. | |
| 2010/0019377 A1* | 1/2010 | Arvelo | H01L 21/563 257/712 |
| 2012/0211867 A1* | 8/2012 | Seroff | H01L 25/0652 257/532 |
| 2013/0119528 A1* | 5/2013 | Groothuis | H01L 23/36 257/690 |
| 2013/0341803 A1* | 12/2013 | Cheah | H01L 24/05 257/774 |

(Continued)

FOREIGN PATENT DOCUMENTS

| | | |
|---|---|---|
| JP | 2010245384 A | 10/2010 |
| KR | 20110037066 A | 4/2011 |

OTHER PUBLICATIONS

Koyanagi, Mitsumasa "The Stacked Capacitor DRAM Cell and Three-Dimensional Memory", IEEE SSCS News, Winter 2008, pp. 37-41.*

(Continued)

*Primary Examiner* — Erik Kielin
(74) *Attorney, Agent, or Firm* — Perkins Coie LLP

(57) ABSTRACT

Semiconductor device assemblies having stacked semiconductor dies and electrically functional heat transfer structures (HTSs) are disclosed herein. In one embodiment, a semiconductor device assembly includes a first semiconductor die having a mounting surface with a base region and a peripheral region adjacent the base region. At least one second semiconductor die can be electrically coupled to the first semiconductor die at the base region. The device assembly can also include an HTS electrically coupled to the first semiconductor die at the peripheral region.

18 Claims, 6 Drawing Sheets

(56) References Cited

U.S. PATENT DOCUMENTS

| | | | |
|---|---|---|---|
| 2014/0084445 A1* | 3/2014 | Lin | H01L 23/3677 257/698 |
| 2015/0041971 A1* | 2/2015 | Lee | G11C 5/025 257/737 |
| 2015/0200175 A1 | 7/2015 | Hatori et al. | |
| 2015/0279828 A1 | 10/2015 | Koopmans et al. | |
| 2015/0333019 A1* | 11/2015 | Lee | H01L 23/66 257/508 |
| 2016/0013173 A1* | 1/2016 | Vadhavkar | H01L 23/3675 438/109 |
| 2016/0148919 A1 | 5/2016 | Nishimura | |
| 2016/0181125 A1 | 6/2016 | Li et al. | |
| 2016/0254236 A1 | 9/2016 | Kim et al. | |
| 2016/0343687 A1* | 11/2016 | Vadhavkar | H01L 25/0657 |

OTHER PUBLICATIONS

International Application No. PCT/US2018/015661—PCT International Search Report and Written Opinion, dated Jun. 26, 2018, 15 pages
Taiwan Patent Application No. 107104874—Taiwan Office Action, dated Oct. 18, 2018, 19 pages.

* cited by examiner

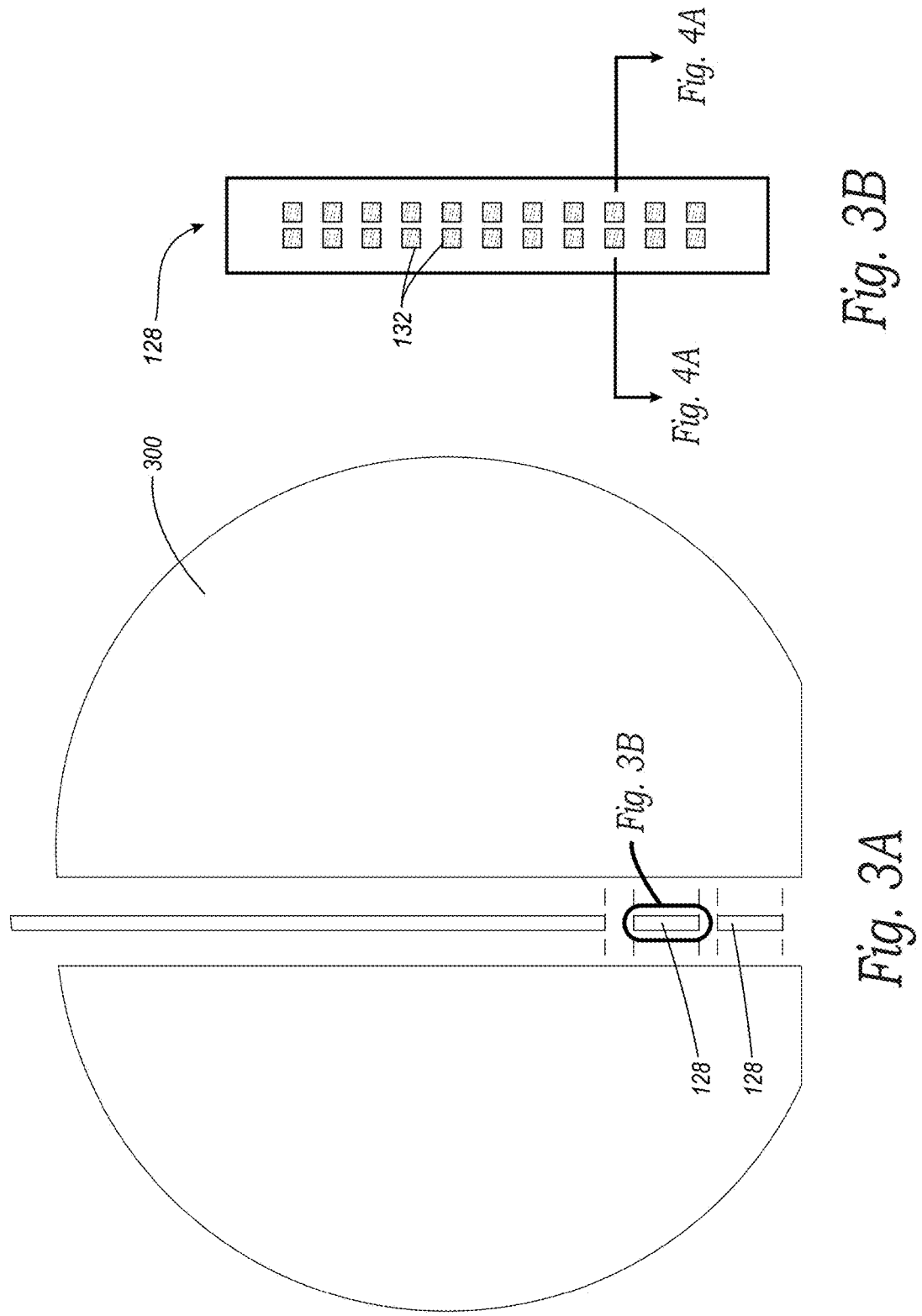

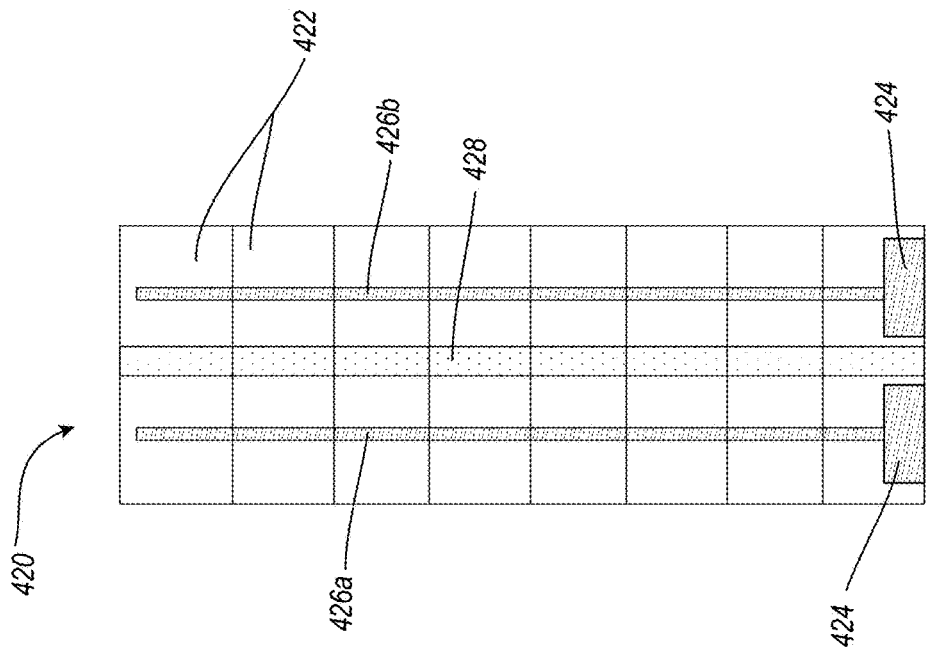
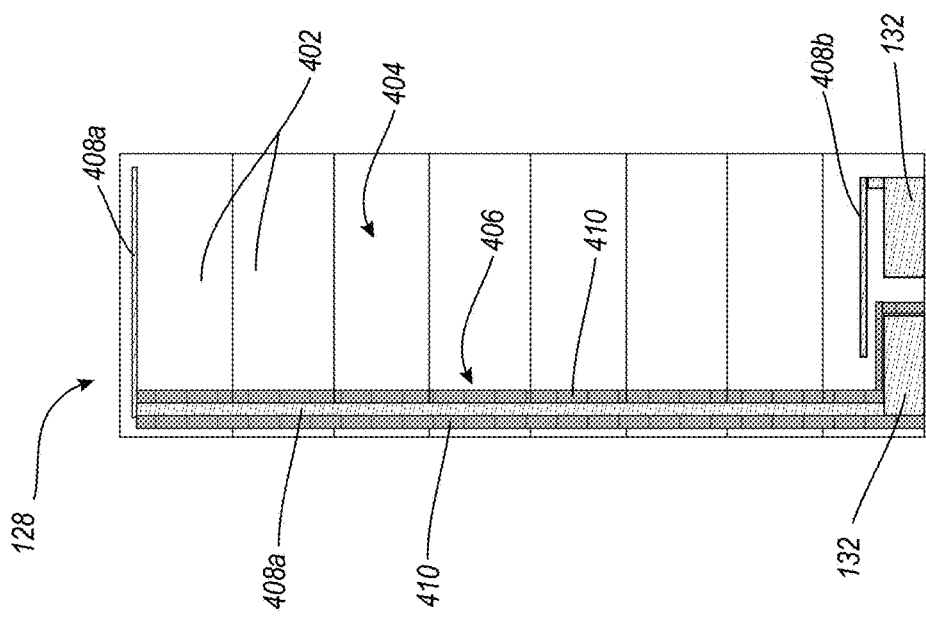

US 10,199,356 B2

SEMICONDUCTOR DEVICE ASSEMBLES WITH ELECTRICALLY FUNCTIONAL HEAT TRANSFER STRUCTURES

TECHNICAL FIELD

The disclosed embodiments relate to semiconductor device assemblies, and in particular to semiconductor device assemblies having electrically functional heat transfer structures.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and/or imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs). In vertically stacked packages, the heat generated is difficult to dissipate, which increases the operating temperatures of the individual dies, the junctions therebetween, and the package as a whole. This can cause the stacked dies to reach temperatures above their maximum operating temperatures in many types of devices.

BRIEF DESCRIPTION OF THE DRAWINGS

FIGS. 3A and 3B are top plan views of electrically functional heat transfer structures that have been cleaved from a semiconductor wafer in accordance with an embodiment of the present technology.

FIGS. 4A and 4B are cross-sectional views of electrically functional heat transfer structures configured in accordance with embodiments of the present technology.

DETAILED DESCRIPTION

Figure 1A:
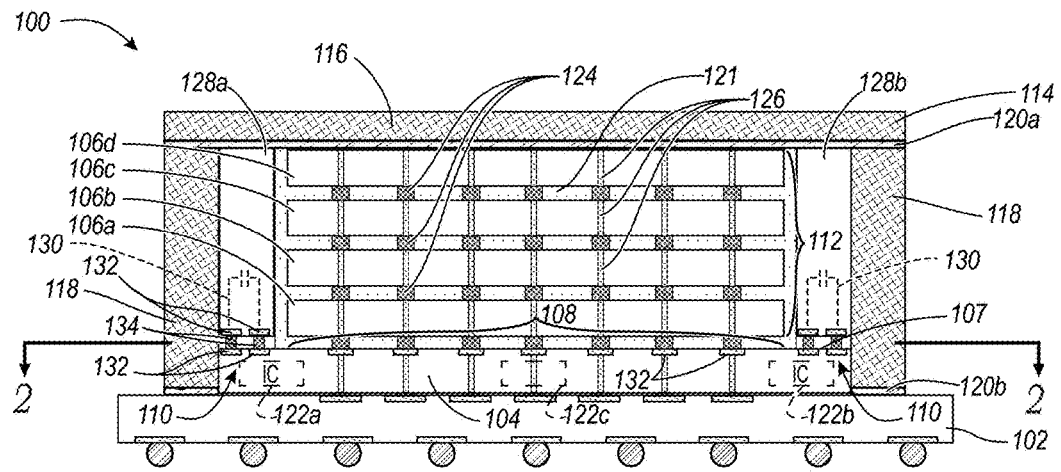
FIGS. 1A and 1B are cross-sectional and partially-exploded cross-sectional views, respectively, showing a semiconductor device assembly having electrically functional heat transfer structures configured in accordance with an embodiment of the present technology.

Specific details of several embodiments of semiconductor device assemblies having electrically functional heat transfer structures are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Several embodiments of the present technology are directed toward a semiconductor device assembly comprising a first semiconductor die, at least one second semiconductor die stacked on the first semiconductor die, and an electrically functional heat transfer structure (HTS). The first semiconductor die includes a mounting surface having a base region and a peripheral region, the peripheral region extends around the perimeter of the base region. The second semiconductor die is electrically coupled to the first semiconductor die at the base region, and the electrically functional HTS is electrically coupled to the first semiconductor die at the peripheral region. The electrically functional HTS efficiently transfers heat from the peripheral region of the first semiconductor die and also provides electrical functionality useful in operating the semiconductor device assembly. As a result, several embodiments of semiconductor device assemblies in accordance with the present technology are expected to provide thermally efficient stacked die arrangements, small package sizes, and/or more space for functional components because both electrical functionality and efficient heat transfer from the peripheral region of the first semiconductor die are performed by a common component.

Figure 1B:
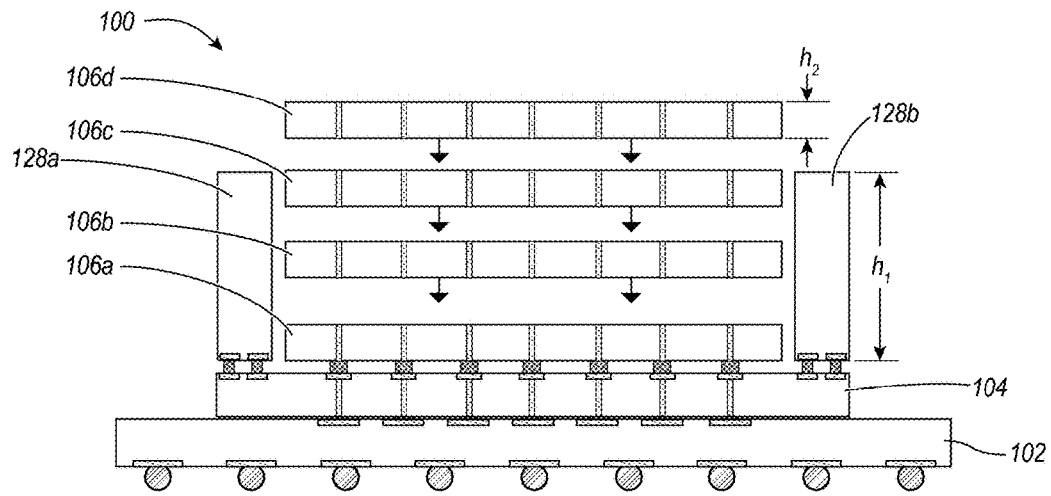

FIGS. 1A and 1B are cross-sectional and partially-exploded cross-sectional views, respectively, showing a semiconductor device assembly 100 having electrically functional heat transfer structures configured in accordance with an embodiment of the present technology. In particular, FIG. 1A is a cross-sectional view showing the assembly 100 after fabrication has been completed, and FIG. 1B is a partially-exploded view illustrating portions of a fabrication process for the assembly 100. Referring to FIG. 1A, the assembly 100 includes a package support substrate 102 (e.g., an interposer), a first semiconductor die 104 mounted to the support substrate 102, and a plurality of second semiconductor dies 106 (identified individually by reference numbers 106a-d) mounted to the first die 104. The first die 104 includes a mounting surface 107 having a base region 108 and a peripheral region 110 (known to those skilled in the art as a "porch" or "shelf"). The second dies 106 are arranged in a stack 112 ("die stack 112") on the base region 108 of the first die 104.

Although the illustrated embodiment of FIGS. 1A and 1B includes the die stack 112 having four individual second dies 106a-d, other embodiments of the present technology can include additional or fewer second dies 106. For example, in several embodiments only one second semiconductor die 106 is mounted to the first semiconductor die 104. In other embodiments, two, three, five, six or more second semiconductor dies 106 can be arranged in a die stack on the first semiconductor die 104.

The assembly 100 further includes a thermally conductive casing or lid 114 having a cap portion 116 and a wall portion 118. In the illustrated embodiment, the cap portion 116 is bonded to the wall portion 118 via a first a bond material 120a (e.g., an adhesive). In other embodiments, the lid 114 can be a contiguous component, with the cap portion 116 integrally formed with the wall portion 118. The wall portion 118 extends vertically away from the cap portion 116 and can be attached to the support substrate 102 by a second bond material 120b (e.g., an adhesive). In addition to providing a protective covering, the lid 114 can serve as a heat spreader to absorb and dissipate thermal energy away from the semiconductor dies 104 and 106. The lid 114 can accordingly be made from a thermally conductive material, such as nickel (Ni), copper (Cu), aluminum (Al), ceramic materials with high thermal conductivities (e.g., aluminum nitride), and/or other suitable thermally conductive materials.

In some embodiments, the first bond material 120a and/or the second bond material 120b can be made from what are known in the art as "thermal interface materials" or "TIMs", which are designed to increase the thermal contact conductance at surface junctions (e.g., between a die surface and a heat spreader). TIMs can include silicone-based greases, gels, or adhesives that are doped with conductive materials (e.g., carbon nano-tubes, solder materials, diamond-like carbon (DLC), etc.), as well as phase-change materials. In other embodiments, the first bond material 120a and/or the second bond material 120b can include other suitable materials, such as metals (e.g., copper) and/or other suitable thermally conductive materials.

Some or all of the first and/or second semiconductor dies 104 and 106 can be at least partially encapsulated in a dielectric underfill material 121. The underfill material 121 can be deposited or otherwise formed around and/or between some or all of the dies to enhance a mechanical connection with a die and/or to provide electrical isolation between conductive features and/or structures (e.g., interconnects). The underfill material 121 can be a non-conductive epoxy paste, a capillary underfill, a non-conductive film, a molded underfill, and/or include other suitable electrically-insulative materials. In several embodiments, the underfill material 121 can be selected based on its thermal conductivity to enhance heat dissipation through the dies of the assembly 100. In some embodiments, the underfill material 121 can be used in lieu of the first bond material 120a and/or the second bond material 120b to attach the lid 114 to the top-most semiconductor die 106d.

The first and second dies 104 and 106 can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, for example, the assembly 100 can be configured as a hybrid memory cube (HMC) in which the stacked second dies 106 are DRAM dies or other memory dies that provide data storage and the first die 104 is a high-speed logic die that provides memory control (e.g., DRAM control) within the HMC. In other embodiments, the first and second dies 104 and 106 may include other semiconductor components and/or the semiconductor components of the individual second dies 106 in the die stack 112 may differ. In the embodiment illustrated in FIG. 1A, the first die 104 includes a plurality of integrated circuits 122 (identified individually as a first integrated circuit 122a, a second integrated circuit 122b, and a third integrated circuit 122c) that can be electrically coupled to each other and/or to other circuits and/or components within the first die 104. Additionally, as described in more detail below, the integrated circuits 122 can be part of associated circuits that include circuit components that are external to the first die 104.

The first and second dies 104 and 106 can be electrically coupled to the package support substrate 102 and to one another by a plurality of electrically conductive elements 124 (e.g., copper pillars, solder bumps, and/or other conductive features). Additionally, each of the first and second dies 104 and 106 can include a plurality of through-silicon vias (TSVs) 126 that are coupled on opposite sides to the conductive elements 124. In addition to electrical communication, the conductive elements 124 and the TSVs 126 transfer heat at least vertically away from the die stack 112 and toward the lid 114. In some embodiments, the assembly 100 can also include a plurality of thermally conductive elements or "dummy elements" (not shown) positioned interstitially between the first and second dies 104 and 106 to further facilitate heat transfer through the die stack 112. Such dummy elements can be at least generally similar in structure and composition to the conductive elements 124 and/or the TSVs 126 except that they are not electrically coupled to the functional circuitry of the first and second dies 104 and 106.

The assembly 100 includes a plurality of electrically functional heat transfer structures (HTSs) 128 (identified individually as a first HTS 128a and a second HTS 128b) mounted to the peripheral region 110 of the first die 104. In several embodiments, one or more of the integrated circuits 122 can be part of associated circuits that produce relatively large amounts of heat during operation, such as serial/deserializer (SERDES) circuits. The HTSs 128 can form one or more electronic components that form at least portions of the circuits associated with the integrated circuits 122. In the illustrated embodiment of FIG. 1A, for example, the HTSs 128 include capacitors 130 that can be electrically coupled to the integrated circuits 122 (and/or to other integrated circuits or components within the first die 104) via conductive elements 134 between bond pads 132 on the first die 104 and the HTSs 128.

In several embodiments, the HTSs 128 can include materials selected to provide desired electrical properties. For example, the HTS 128 can be a stacked component formed from multiple volumes (e.g., layers) of silicon. In some embodiments, the individual silicon volumes can provide approximately 110 fF/$\mu m^2$ of capacitance and the individual HTSs 128 can have footprints of approximately 2 mm×13 mm. In a particular embodiment, the HTSs can include eight such volumes of silicon, corresponding to an overall capacitance of approximately 20 µF. In other embodiments, the HTSs 128 can include other dimensions that are larger or smaller than 2 mm×13 mm, and overall capacitance that is greater or less than 20 µF. In operation, the capacitance provided by the HTSs 128 can generate relatively significant heat that would otherwise be generated by capacitors attached to or positioned within other components of the assembly 100 (e.g., attached to the substrate 102 or positioned within the first die 104).

As shown in FIG. 1A, the HTSs 128 are positioned adjacent or proximate to the lid 114. In particular, the HTSs 128 extend laterally between the die stack 112 and the wall portion 118 of the lid 114, and vertically from the first semiconductor die 104 to the cap portion 116. Accordingly, the heat generated by the HTSs 128 can be readily transferred to the lid 114, and thereby transferred to an environment or component external to the lid 114. Heat transfer from the HTSs 128 to the lid 114 can significantly reduce the operating temperature of the assembly 100. In particular, compared to components positioned on the substrate 102 or within the first die 104, the HTSs 128 rapidly transfer heat to the cap portion 116 and the wall portion 118. In several embodiments, the HTSs 128 can be in direct contact with the lid 114. In other embodiments, a filler material and/or other components or materials can be between the HTSs 128 and the lid 114 (e.g., the first bond material 120a). In embodiments with such an intervening material, the HTSs 128 can remain relatively close to the lid 114 and/or in indirect contact with the lid 114 to maintain a high thermal transfer rate from the HTSs 128 to the lid 114. For example, the intervening material can be selected to include appropriate thermal conductivity (e.g., TIMs).

In addition to thermal efficiency, embodiments of the present technology can enable small package sizes and/or increase the space available for functional components. For example, in existing semiconductor packages, a variety of electrical devices or components are often integrated or mounted on the associated package substrate, adjacent to the stacked dies (e.g., surface mounted devices or integrated passive devices). Such an arrangement requires a package substrate with available space outside of the footprint of a base die, and therefore requires a larger overall device. The HTSs 128 disclosed herein can be positioned adjacent to the die stack 112 in a portion of the assembly 100 that would otherwise be occupied by filler material or other nonelectrical components or features that do not directly contribute to the electrical functioning of the assembly 100 (e.g., passive thermal components). Accordingly, incorporating electrical components and functionality within the HTSs 128 can obviate electrical devices or components that would otherwise be positioned on the package substrate. This can result in small package sizes, and/or additional space for larger or additional components that provide greater performance and functionality (e.g., larger first dies 104).

The partially-exploded view of FIG. 1B illustrates a portion of the fabrication process for the assembly 100. In particular, the second dies 106 and the HTSs 128 can be separately fabricated and subsequently attached to the first die 104. Referring to FIGS. 1A and 1B together, the HTSs 128 have a height $h_1$ that corresponds to a height of the uppermost surface of the die stack 112 (e.g., a height equal to the sum of the heights $h_2$ of the individual second dies 106 plus the conductive elements 124 therebetween). Accordingly, when assembled, the cap portion 116 of the lid 114 can be thermally coupled to the uppermost surface of the second die 106d and with one or more of the HTSs 128. As shown in FIG. 1A, the cap portion 116 indirectly contacts one or more of the HTSs 128 via the first bond material 120a (and/or via other alternative or additional intervening materials). In other embodiments, the cap portion 116 can directly contact one or more of the HTSs 128. Irrespective of whether the cap portion 116 directly or indirectly contacts the HTSs 128, or is otherwise sufficiently close to the HTSs 128, the proximity of the HTSs 128 to the cap portion 116 can provide for relatively substantial heat transfer out of the assembly 100.

Although the illustrated embodiment of FIGS. 1A and 1B includes HTSs 128 mounted to the first semiconductor die 104, other embodiments can include HTSs 128 mounted to other components. For example, in several embodiments the HTSs 128 can be mounted to the substrate 102. In some of these embodiments, the HTSs 128 can extend from the substrate 102 to the cap portion 116, and from the first die 104 and the second dies 106 to the wall portion 118. Additionally, several of these embodiments can include a redistribution layer or other electrical components or circuitry within the substrate 102 to provide for electrical connections between the HTSs 128 and the first die 104 and/or the second dies 106.

Figure 2:
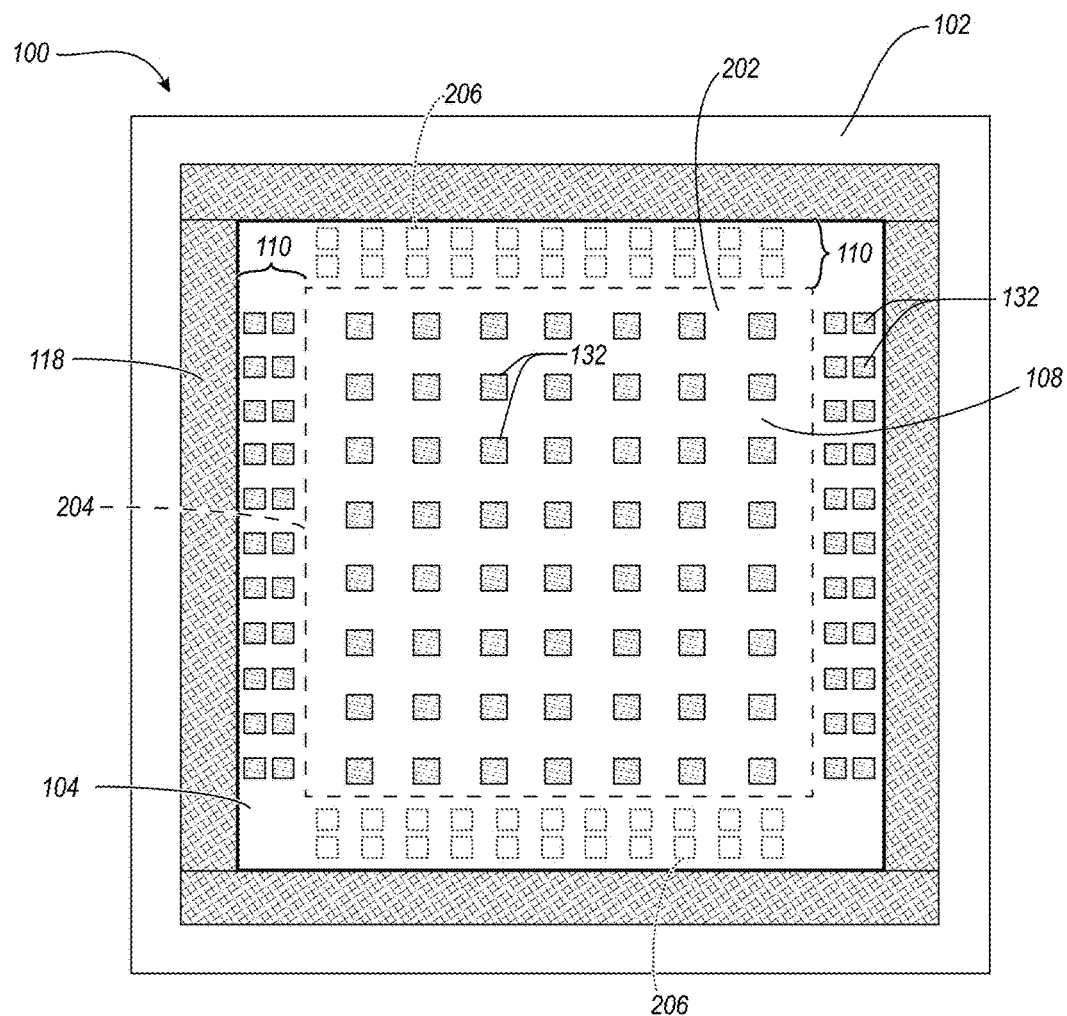
FIG. 2 is a top plan view of the semiconductor device assembly of FIGS. 1A and 1B.

FIG. 2 is a top plan view of the semiconductor device assembly 100 of claim 1 along line 2-2 of FIG. 1A. The base region 108 occupies a majority of a mounting surface 202 of the first semiconductor die 104 and is at least partially delineated by a boundary or perimeter 204 that can correspond to a footprint of the second semiconductor dies 106 (FIGS. 1A and 1B). The peripheral region 110 extends around the perimeter 204, and bond pads 132 are positioned within both the base region 108 and the peripheral region 110. As shown in the cross-sectional views of FIGS. 1A and 1B, the first HTS 128a and the second HTS 128b are positioned on two opposing sides of the second dies 106. It is to be understood, however, that additional HTSs 128 can be positioned adjacent additional sides of the second dies 106. For example, the first die 104 can include additional bond pads 206 (shown in dashed lines) to mount additional HTSs 128 adjacent to other opposing sides of the second dies 106. In such embodiments, the additional HTSs 128 can be electrically connected to the integrated circuits 122, or to other components or circuits within the first semiconductor die 104 via the additional bond pads 206. In several embodiments, the base region 108 can occupy a larger portion of the mounting surface 202 than that shown in FIG. 2. For example, the peripheral region 110 can extend on two opposing sides of the base region 108, and the base region 108 can extend through at least a portion of the mounting surface 202 occupied by the additional bond pads 206 shown in FIG. 2. In such embodiments, the base region 108 can be delineated from the peripheral region 110 by two boundary lines extending coaxially along respective opposite portions of the perimeter 204.

FIGS. 3A and 3B are top plan views of heat transfer structures 128 that have been cleaved from a semiconductor wafer 300 in accordance with an embodiment of the present technology. The wafer 300 can be fabricated via a variety of techniques known in the art (e.g., physical vapor deposition, chemical vapor deposition, lithography, etching, etc.). The fabrication can include the deposition of multiple volumes (e.g., layers) of semiconducting materials (e.g., silicon) to form the volumes of the HTSs 128. Additionally, the fabrication can include the formation of interconnects, the bond pads 132, through-silicon vias (TSVs) and/or other features via a variety of semiconductor fabrication techniques. Subsequent to the formation of the wafer 300, the HTSs 128 can be singulated from the wafer 300 via, e.g., dicing.

The wafer 300 shown in FIG. 3A is not drawn to scale, but can include a diameter of, e.g., 300 mm. The individual HTSs 128 (which are also not drawn to scale) can be fabricated to have a variety of sizes that can be customized for the particular design requirement of an associated device assembly. For example, in some embodiments individual HTSs 128 can include a footprint of 2 mm×13 mm. The relatively small size of the HTSs 128 in comparison to the wafer 300 can provide for the production of a large number of HTSs 128 from the single wafer 300. In one embodiment, for example, a single 300 mm wafer can yield approximately 2000 individual HTSs 128.

As shown in FIG. 3B, the individual HTSs 128 can include a plurality of bond pads 132. The bond pads 132 can be arranged in a variety of manners, and can provide electrical connections to one or more electrical components of the associated HTS 128. In the illustrated embodiment, the HTS 128 includes 11 pairs of bond pads 132 spaced along a mounting surface 302. Each individual bond pad pair can be associated with an individual electrical component of the associated HTS 128, as described in more detail below. Additionally, as can be seen by comparing FIGS. 2 and 3B, the bond pads 132 of the HTS 128 can be aligned with the bond pads 132 on the first semiconductor die 104 to electrically couple the HTS 128 to the first semiconductor die 104. In particular, the bond pads 132 of the HTS 128 are arranged in an array to be superimposed with the bond pads 132 of the first semiconductor die 104 (as shown in FIG. 1A).

FIG. 4A is a cross-sectional view of an embodiment of the HTS 128 along the line 4A-4A of FIG. 3B in accordance with the present technology. In the illustrated embodiment, the HTS 128 includes a plurality of electrically functional volumes or layers 402 forming a capacitor 404. In particular, the HTS 128 includes eight vertically stacked volumes of silicon 402. In several embodiments, the volumes 402 can include one or more doped or undoped regions. In one embodiment, one or more of the volumes 402 can directly contact immediately adjacent volumes 402, as shown in FIG. 4A. In other embodiments, air gaps or intervening materials (e.g., dielectric material) may be positioned between one or more adjacent volumes 402. The HTS 128 further includes a through-silicon via (TSV) 406 having a first conductive material 408a (e.g., a metal) and an insulating or dielectric material 410 electrically isolating a portion of the first conductive material 408a from the volumes 402. The HTS 128 can further include a second conductive material 408b spaced apart from the first conductive material 408a with at least a portion of the volumes 402 between the first and second conductive materials 408a and 408b. The first conductive material 408a and the second conductive material 408b are electrically coupled to corresponding bond pads 132. The first conductive material 408a extends through a portion of the uppermost volume 402. In operation, the volumes 402 (and/or any gaps or intervening materials) provide capacitance along a path between the first conductive material 408a in the uppermost volume 402 and the second conductive material 408b in the lowermost volume 402.

FIG. 4B is a cross-sectional view illustrating an electrically functional heat transfer structure (HTS) 420 configured in accordance with another embodiment of the present technology. Similar to FIG. 4A, the cross-sectional view of FIG. 4B illustrates the HTS 420 along a line corresponding to that of line 4A-4A in FIG. 3B. The HTS 420 includes eight vertically stacked volumes of silicon 422, bond pads 424, first conductive material 426a, second conductive material 426b, and dielectric material 428. In operation, the volumes 422 and/or the dielectric material 428 can provide capacitance between the first conductive material 426a and the second conductive material 426b.

In several embodiments, individual electrically functional elements, components or structures of individual HTSs 128 or 420 can be electrically isolated from one another via one or more electrical barriers. For example, a vertical barrier can be created between adjoining capacitors and/or other electrically functional components within the HTSs 128 or 420 via etching or other techniques known in the art. For example, the HTS 128 shown in FIG. 3B can include eleven electrically functional components (each with a corresponding pair of bond pads 132) separated via ten vertical barriers positioned between adjacent electrically functional components.

Figure 5:
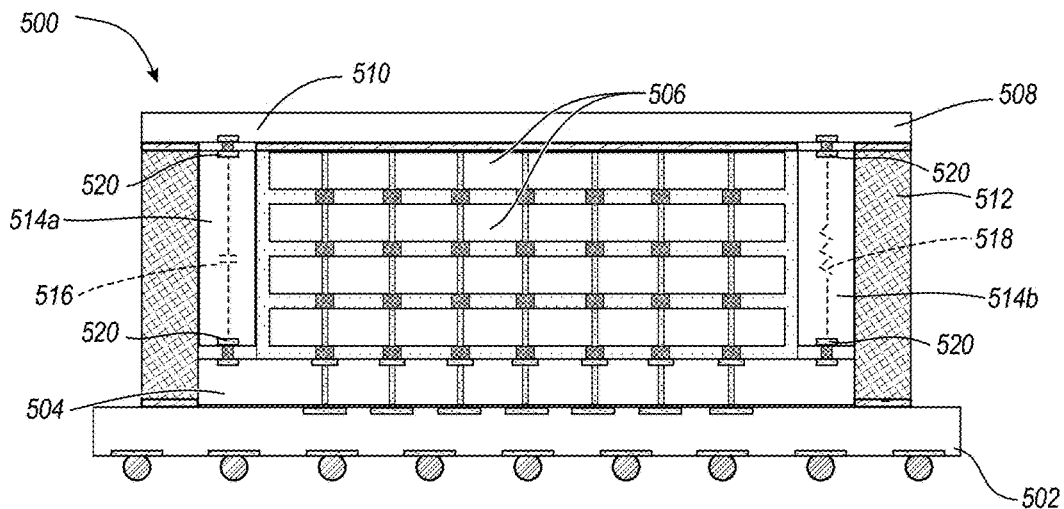
FIGS. 5 and 6 are cross-sectional views showing semiconductor device assemblies having electrically functional heat transfer structures configured in accordance with embodiments of the present technology.
Figure 6:
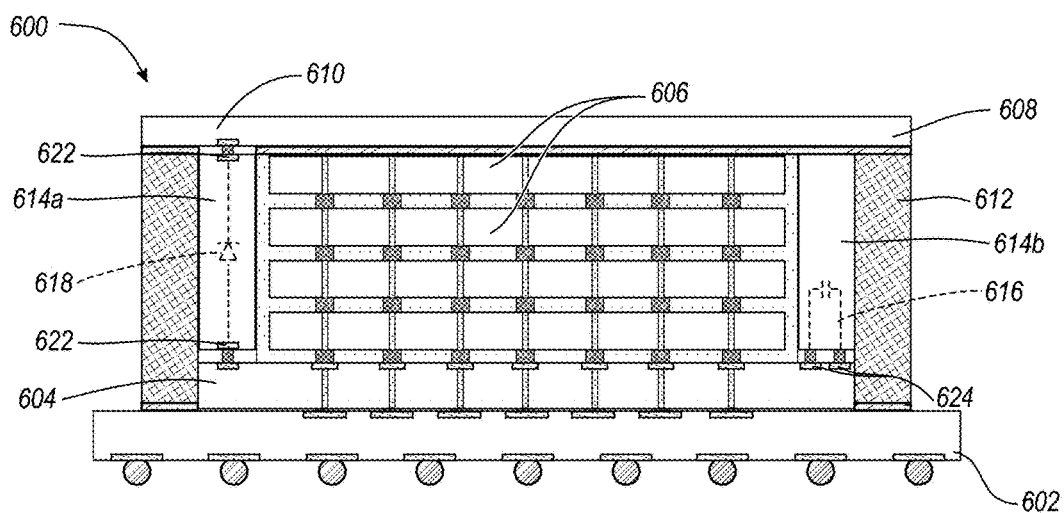

FIGS. 5 and 6 are cross-sectional views of semiconductor device assemblies 500 and 600, respectively, having electrically functional heat transfer structures (HTSs) configured in accordance with embodiments of the present technology. In the illustrated embodiment of FIG. 5, the assembly 500 includes a variety of components that are at least generally similar to corresponding components in the assembly 100 discussed above with respect to FIGS. 1A and 1B. For example, the assembly 500 includes a support substrate 502, a first semiconductor die 504, a plurality of second semiconductor dies 506, and a lid 508 having a cap portion 510 and a wall portion 512. Additionally, the assembly 500 includes a first electrically functional heat transfer structure (HTS) 514a and a second HTS 514b. The first HTS 514a and the second HTS 514b can include several features that are at least generally similar to the HTSs 128 and 420, including a plurality of vertically stacked volumes of silicon forming one or more capacitors 516 (shown schematically) or other electrically functional components such as a resistor 518 (also shown schematically). However, rather than having bond pads on a common side of the associated HTS, the HTSs 514 include bond pads 520 on opposing sides to provide for connections between circuits within the first die 504 and circuits that are external to the assembly 500 (e.g., circuits within another assembly that can be mounted to the assembly 500). In some embodiments having these features, the lid 508 can be electrically functional or have electrically functional circuitry.

The second HTS 514b can be formed from one or more volumes of material in a manner at least generally similar to that of the HTSs 128, 420 and 514a. For example, the second HTS 514b can include multiple vertically stacked volumes of material. However, rather than forming a capacitive component, the one or more materials can form resistive components. In one embodiment, for example, the one or more materials can include polysilicon resistors.

As with the assembly 500, the assembly 600 also includes a variety of components that are at least generally similar to corresponding components in the assembly 100 discussed above with respect to FIGS. 1A and 1B. For example, the assembly 600 includes a support substrate 602, a first semiconductor die 604, a plurality of second semiconductor dies 606, and a lid 608 having a cap portion 610 and a wall portion 612. Additionally, the assembly 600 includes a first electrically functional heat transfer structure (HTS) 614a and a second HTS 614b. The second HTS 614b can be substantially similar to the HTSs 128 discussed above and can include a capacitor 616 (shown schematically). The first HTS 614a can include a diode 618 (also shown schematically).

Similar to the first HTS 514a discussed above with respect to FIG. 5, the first HTS 614a can also include bond pads 622 electrically coupled to circuits external to the assembly 600. In contrast, the second HTS 614b includes bond pads 624 electrically coupled to one or more circuits within the assembly 600 (e.g, within the first semiconductor die 604). Accordingly, together, the first HTS 614a and the second HTS 614b can provide for both internal and external electrical connections. Additionally, in several embodiments, individual HTSs configured in accordance with the present technology can include bond pads that provide for internal and external electrical connections. For example, an individual HTS can include a pair of bond pads on a common side that are connected to a first electrically functional component in the HTS, and a pair of bond pads on opposing sides that are connected to a second electrically functional component. Moreover, in several embodiments HTSs can include more than one variety of electrical components within the same individual HTS (e.g., a capacitor and a resistor, a diode and a capacitor, etc.).

Figure 7:
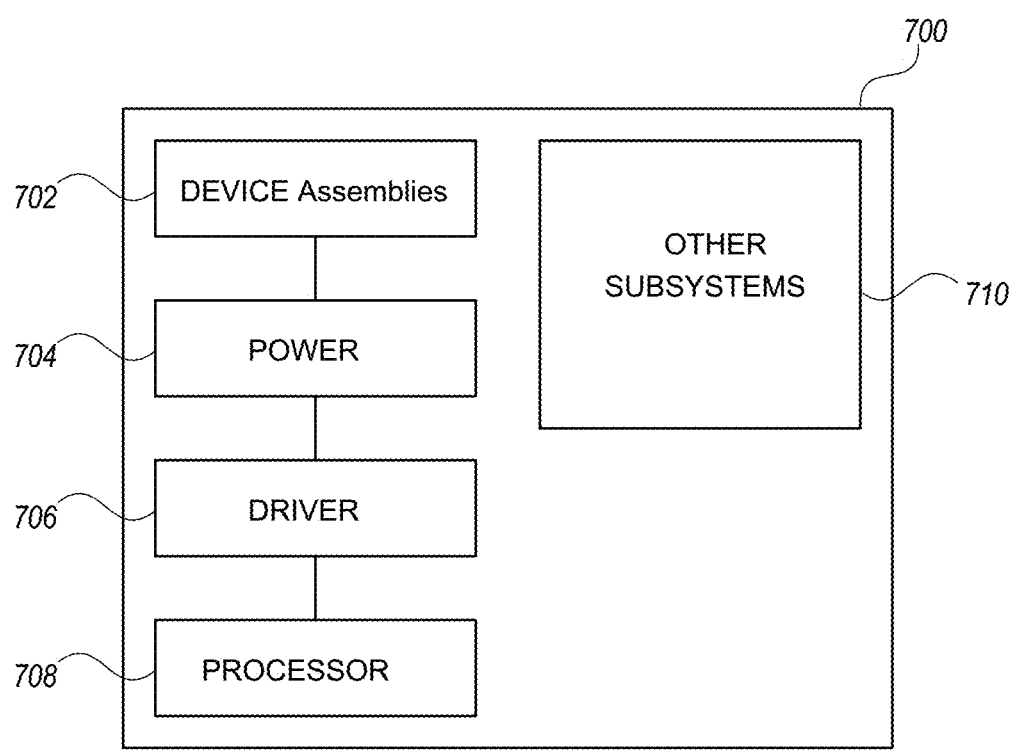
FIG. 7 is a schematic view showing a system that includes a semiconductor device assembly configured in accordance with an embodiment of the present technology.

Any one of the stacked semiconductor device assemblies described above with reference to FIGS. 1A-6 can be incorporated into any of a myriad of larger and/or more complex systems, a representative example of which is system 700 shown schematically in FIG. 7. The system 700 can include a semiconductor device assembly 702, a power source 704, a driver 706, a processor 708, and/or other subsystems or components 710. The semiconductor device assembly 702 can include features generally similar to those of the semiconductor device assemblies 100, 500 and 600 described above with reference to FIGS. 1A-6, and can therefore include a variety of HTSs that can enhance heat dissipation. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, vehicles, appliances and other products. Components of the system 700 may be housed in a single unit or distributed over multiple, interconnected units (e.g., through a communications network). The components of the system 700 can also include remote devices and any of a wide variety of computer readable media.

From the foregoing, it will be appreciated that specific embodiments of the technology have been described herein for purposes of illustration, but that various modifications may be made without deviating from the disclosure. Additionally, the various elements and features illustrated in the Figures may not be drawn to scale; and various embodiments of the disclosure can include structures other than those illustrated in the Figures and are expressly not limited to the structures shown in the Figures. Further, although many of the embodiments of HTSs are described with respect to HMCs, in other embodiments HTSs can be configured for use with other memory devices or other types of stacked die assemblies. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A semiconductor device assembly, comprising:
    a first semiconductor die including a mounting surface having a base region and a peripheral region peripheral to and extending around at least a portion of the base region;
    at least one second semiconductor die over the base region and electrically coupled to the first semiconductor die; and
    an electrically functional heat transfer structure (HTS) coupled to the first semiconductor die at the peripheral region and spaced outwardly apart from the at least one second semiconductor die,
    wherein the HTS includes a first HTS bond pad electrically coupled to a first conductive material and a second HTS bond pad electrically coupled to a second conductive material, the second conductive material being spaced apart from the first conductive material such that the first and second conductive materials comprise at least a portion of a capacitor, and
    wherein the HTS includes a plurality of volumes of silicon, at least a portion of the volumes of silicon comprising the capacitor.

2. The semiconductor device assembly of claim 1 wherein the first semiconductor die includes an integrated circuit, and wherein the HTS is electrically coupled to first semiconductor die via the integrated circuit.

3. The semiconductor device assembly of claim 1, further comprising a lid having a cap portion, and wherein the HTS is in indirect contact with the cap portion via an intervening material.

4. The semiconductor device assembly of claim 3 wherein the lid further includes a wall portion, and wherein the HTS is positioned proximate to the wall portion.

5. The semiconductor device assembly of claim 1 wherein:
    the HTS is structurally distinct from the first and second semiconductor dies,
    the HTS is positioned only within the peripheral region, and
    the at least one second semiconductor die is positioned only within the base region.

6. The semiconductor device assembly of claim 1 wherein the first semiconductor die includes a first side adjacent the HTS, and a first bond pad at the first side and generally aligned with the first HTS bond pad, the semiconductor device assembly further comprising a conductive element electrically coupling the first HTS bond pad to the first bond pad.

7. The semiconductor device assembly of claim 1 wherein the HTS includes:
    a dielectric material between the first and second conductive materials.

8. The semiconductor device assembly of claim 1, further comprising a lid having a cap portion and a wall portion, wherein the at least one second semiconductor die includes a plurality of vertically-stacked second semiconductor dies, and wherein the HTS is positioned vertically between the first semiconductor die and the cap portion and laterally between the plurality of second semiconductor dies and the wall portion.

9. The semiconductor device assembly of claim 1, further comprising a lid having a wall portion peripheral to the first and second semiconductor dies, wherein an upper most surface of the wall portion is coplanar with an upper most surface of the HTS.

10. The semiconductor device assembly of claim 1, further comprising:
a base substrate;
a lid mounted to the base substrate and including a wall portion peripheral to the first semiconductor die, and a cap portion over the at least one second semiconductor die; and
an adhesive material extending continuously between the (a) cap portion and (b) upper surfaces of the wall portion, the HTS and the at least one second semiconductor die.

11. A semiconductor device assembly, comprising:
a package substrate;
a semiconductor die mounted to the package substrate and having a base region, a peripheral region peripheral to the base region, and an integrated circuit;
a semiconductor die stack mounted to the base region of the semiconductor die; and
an electrically functional heat transfer structure (HTS) mounted to the peripheral region of the semiconductor die and including a first HTS bond pad electrically coupled to a first conductive feature and a second HTS bond pad electrically coupled to a second conductive feature separated from the first conductive feature, wherein the first and second conductive features comprise at least a portion of an electrical component electrically coupled to the integrated circuit of the semiconductor die
wherein the electrical component is a capacitor, and the HTS includes a plurality of volumes of silicon comprising the capacitor.

12. The semiconductor device assembly of claim 11, further comprising a lid having a cap portion and a wall portion, wherein the lid is mounted to the package substrate directly proximate the wall portion, and wherein the HTS vertically extends from the semiconductor die to a position adjacent to and in contact with the cap portion.

13. The semiconductor device assembly of claim 12 wherein the contact between the HTS and the cap portion is direct contact.

14. The semiconductor device assembly of claim 12 wherein the contact between the HTS and the cap portion is indirect contact via an intervening material.

15. The semiconductor device assembly of claim 11 wherein the electrical component is a resistor.

16. A semiconductor device assembly, comprising:
a support substrate;
a first semiconductor die mounted to the support substrate, wherein the first semiconductor die includes a first integrated circuit and a second integrated circuit;
a die stack including a plurality of second semiconductor dies, wherein the die stack is mounted to the first semiconductor die and electrically coupled to the first integrated circuit; and
an electrically functional heat transfer structure (HTS) mounted over the support substrate and peripheral to the die stack, wherein the HTS is electrically coupled to the second integrated circuit, and wherein the HTS includes a first HTS bond pad electrically coupled to a first conductive material and a second HTS bond pad electrically coupled to a second conductive material, the second conductive material being separated from the first conductive material such that the first and second conductive materials comprise at least a portion of a capacitor,
wherein the HTS includes a plurality of volumes of silicon, at least a portion of the volumes of silicon being between the first and second conductive materials, and
wherein the first and second HTS bond pads provide an electrical connection to a capacitive electrical path that is at least partially formed via the volumes of silicon.

17. The semiconductor device assembly of claim 16, further comprising a lid mounted to the support substrate and including a cap portion extending in a lateral direction and a wall portion extending in a vertical direction, wherein the HTS is positioned (a) laterally between the wall portion and the die stack, and (b) vertically between the cap portion and the first semiconductor die.

18. The semiconductor device assembly of claim 17 wherein the HTS is in indirect contact with the lid via an intervening material.

* * * * *